United States Patent
Kim et al.

(10) Patent No.: US 7,385,414 B2
(45) Date of Patent: Jun. 10, 2008

(54) IMPEDANCE CONTROLLABLE OUPUT DRIVE CIRCUIT IN SEMICONDUCTOR DEVICE AND IMPEDANCE CONTROL METHOD THEREFOR

(75) Inventors: Tae-Hyoung Kim, Seongnam-si (KR); Ji-Suk Kwon, Seoul (KR); Uk-Rae Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 48 days.

(21) Appl. No.: 11/417,969

(22) Filed: May 4, 2006

(65) Prior Publication Data

US 2006/0250157 A1 Nov. 9, 2006

(30) Foreign Application Priority Data

May 9, 2005 (KR) ................ 10-2005-0038407

(51) Int. Cl.
*H03K 17/16* (2006.01)
*H03K 19/003* (2006.01)

(52) U.S. Cl. .......................... 326/30; 326/32
(58) Field of Classification Search ............. 326/30, 326/32

See application file for complete search history.

(56) References Cited

U.S. PATENT DOCUMENTS

| | | | | |
|---|---|---|---|---|
| 6,163,499 A * | 12/2000 | Suzuki | ............... | 365/230.06 |
| 6,366,139 B1 | 4/2002 | Ang et al. | | |
| 6,525,558 B2 * | 2/2003 | Kim et al. | ............... | 326/30 |
| 6,556,038 B2 * | 4/2003 | Kim et al. | ............... | 326/30 |
| 6,642,740 B2 * | 11/2003 | Kim et al. | ............... | 326/30 |
| 6,919,738 B2 * | 7/2005 | Kushida | ............... | 326/82 |
| 7,019,553 B2 * | 3/2006 | Blodgett et al. | ............... | 326/30 |

* cited by examiner

*Primary Examiner*—Rexford Barnie
*Assistant Examiner*—Dylan White
(74) *Attorney, Agent, or Firm*—F. Chau & Assoc., LLC

(57) ABSTRACT

A drive circuit having impedance control includes an impedance matching array unit having a plurality of transistors, the plurality of transistors selectively driven in accordance with an array drive control signal generated by control code data, and an update prohibition control unit for generating a transfer control signal to prohibit driving the transistors during a first time interval occurring when internal data transition, and applying the transfer control signal to the impedance matching array unit.

12 Claims, 8 Drawing Sheets

IMPEDANCE CONTROLLABLE OUPUT DRIVE CIRCUIT IN SEMICONDUCTOR DEVICE AND IMPEDANCE CONTROL METHOD THEREFOR

CROSS-REFERENCE TO RELATED APPLICATION

This application claims the benefit of Korean Patent Application No. 10-2005-0038407, filed May 9, 2005, the disclosure of which is incorporated herein by reference in its entirety.

BACKGROUND OF THE INVENTION

1. Technical Field

The present invention relates to impedance control in semiconductor devices and, more particularly, to an impedance controllable output drive circuit and an impedance control method, which is capable of checking a process, voltage and temperature (PVT) variation and automatically performing an impedance matching.

2. Discussion of Related Art

A semiconductor device can include pins to transmit data from or to the outside, and a data output circuit functioning as a data output buffer and driver circuit to provide internal data to the outside. The pins can be connected to transmission lines such as printed wiring provided on a mounting substrate in the semiconductor device incorporated into an electrical appliance. The pins can charge or discharge a floating capacitance or load capacitance (parasitic capacitance) existing on the mounting substrate. In an output drive circuit, output impedance ZQ can be controlled to match the output impedance with the transmission line to minimize distortion in the output signal caused by impedance mismatch.

When semiconductor devices are operated at higher speeds, the signal pulse width decreases, the influence of external noise increases, and the reflection of an output signal from an impedance mismatch in an interface terminal becomes a concern. Thus, a programmable impedance control scheme is employed to perform an input/output impedance matching. An example of a programmable impedance control (PIC) is disclosed in U.S. Pat. No. 6,307,424.

Another impedance control method is by use of a high speed transceiver logic (HSTL) interface, wherein one extra pin is used to control a desired output impedance value within a tolerance of about dozens of ohms. In such a scheme, it is often difficult to obtain a precise output impedance value due to changes in operating parameters such as power source voltage, operating temperature and manufacturing process.

U.S. Pat. No. 6,466,487 discloses in FIGS. 1a and 1b a programmable impedance control circuit, which includes an impedance update based on PVT variations, i.e., when a PVT variation is detected through a ZQ pad, up/down counting data is generated by counters 224 and 225. An update controller 52 receiving the counting data through registers 51 and 53 of FIG. 1b transmits control code data for an impedance update to an output drive circuit 1. In performing the impedance control by transmitting digitally coded control code data as described above, a change in the digitally coded control code data momentarily causes an impedance mismatch and may have an undesirable influence upon the data transmission.

FIG. 2 is a block diagram of a conventional impedance controllable output drive circuit. The circuit of FIG. 2 includes pull-up units 10-14 and pull-down units 20-24 corresponding to a pull-up transistor group 1a and a pull-down transistor group 1b within an output buffer 1 as in FIG. 1b, and an output pad 30 corresponding to the input/output pad 20 of FIG. 1B.

FIG. 2 illustrates a block configuration of an impedance controlled output driver, wherein a plurality of pull-up units 10-14 and a plurality of pull-down units 20-24 are connected commonly to the output pad 30. Pull-up control code data P[0:n] control impedance of pull-up units 10-14, and pull-down control code data N[0:n] control impedance of pull-down units 20-24. The pull-up control code data P[0:n] and pull-down control code data N[0:n] are changed from a high logic level to a low logic level, or from a low logic level to a high logic level, in conformity with a PVT variation, and are allocated to the corresponding pull-up units 10-14 and pull-down units 20-24. Thus, the number of activated transistor arrays of the pull-up units 10-14 and pull-down units 20-24 is controlled to update the impedance.

A control code to control the pull-up and pull-down impedances depends upon a value of internal data DinB, and performs an update for one of the pull-up and pull-down units. For example, when the internal data DinB is '1' or 'high' logic level, output data represented on the output pad 30 is output as a value of '0' or 'low' logic level. Thus a pull-down control code is not updated, but a pull-up control code is updated. On the contrary, when the internal data DinB is '0', an output data is '1', thus a pull-down impedance code is updated.

FIG. 3 is a circuit diagram illustrating an example of the configuration of pull-up and pull-down units shown in FIG. 2. For example, FIG. 3 illustrates a detailed configuration of one pull-up unit 10a and one pull-down unit 20a. With reference to FIG. 3, the pull-up unit 10a includes a pass transistor P1, a latch L1 constructed of two inverters IN2 and IN3, a NOR gate NOR1, an inverter IN4, a P-type metal oxide semiconductor (MOS) transistor PM1, and a resistance R1 connected to an output pad 30. The pull-down unit 20a includes a pass transistor P2, a latch L2 constructed of two inverters IN11 and IN12, a NAND gate NAN1, an inverter IN13, an N-type MOS transistor NM1, and a resistance R2 connected to the output pad 30.

In FIG. 3, when internal data DinB is '1', the pass transistor P1 within the pull-up unit 10a is activated, and a correspondingly applied pull-up control code P_CODE is updated to the latch L1, and output data is output as '0' by an activation of N-type MOS transistor NM1. When the internal data DinB is '0', the pass transistor P2 within the pull-down unit 20a is activated, a pull-down control code N_CODE is updated to the latch L2, and output data is output as '1' by an activation of P-type MOS transistor PM1.

The circuits of FIGS. 2 and 3 can experience difficulties when a pull-up code and a pull-down code are simultaneously updated during a time interval when data transition, or when an interim value of an abnormal code is transferred during a code transition. An undesired impedance may be provided momentarily, causing an output signal from the semiconductor device to be distorted or have noise. When a semiconductor device receives a distorted or noisy output signal, a set-up/hold failure or input logic level decision error may be caused.

In performing an impedance update in conformity with a PVT variation, it is desired to reduce an impedance matching error caused during a data transition. Also, a technique to perform an impedance update without a training sequence during a reset operation is desired.

SUMMARY OF THE INVENTION

According to an exemplary embodiment of the present invention, a drive circuit having impedance control includes an impedance matching array unit having a plurality of transistors, the plurality of transistors selectively driven in accordance with an array drive control signal generated by control code data, and an update prohibition control unit for generating a transfer control signal to prohibit driving the transistors during a first time interval occurring when internal data transition, and applying the transfer control signal to the impedance matching array unit.

The update prohibition control unit may include a short pulse generating part for generating the transfer control signal in response to the internal data, and an initial update part, which is connected to the short pulse generating part and by which an impedance update of the impedance matching array unit is performed during a second time interval occurring from after a power reset to before the internal data initially transition.

The impedance matching array unit may include pull-up and pull-down drive control signal generating parts for latching the control code data received in response to the transfer control signal, and gating the control code data with the internal data, and generating the array drive control signal wherein the plurality of transistors is connected commonly.

According to an exemplary embodiment of the present invention, an impedance control method in a semiconductor device includes preparing an impedance matching array unit having a plurality of transistors by which internal data that has been impedance updated is output through an output pad, applying a sampling clock to latch control code data to the impedance matching array unit to perform an impedance update of the impedance matching array unit during a time interval occurring from a power reset to before the internal data initially transition, and applying the sampling clock to latch the control code data to the impedance matching array unit to perform an impedance update of the impedance matching array unit after the internal data transition plus a time delay.

BRIEF DESCRIPTION OF THE DRAWINGS

Exemplary embodiments of the present invention can be understood in more detail from the following description taken in conjunction with the accompanying drawings in which.

DETAILED DESCRIPTION OF EXEMPLARY EMBODIMENTS

Figure 1A:
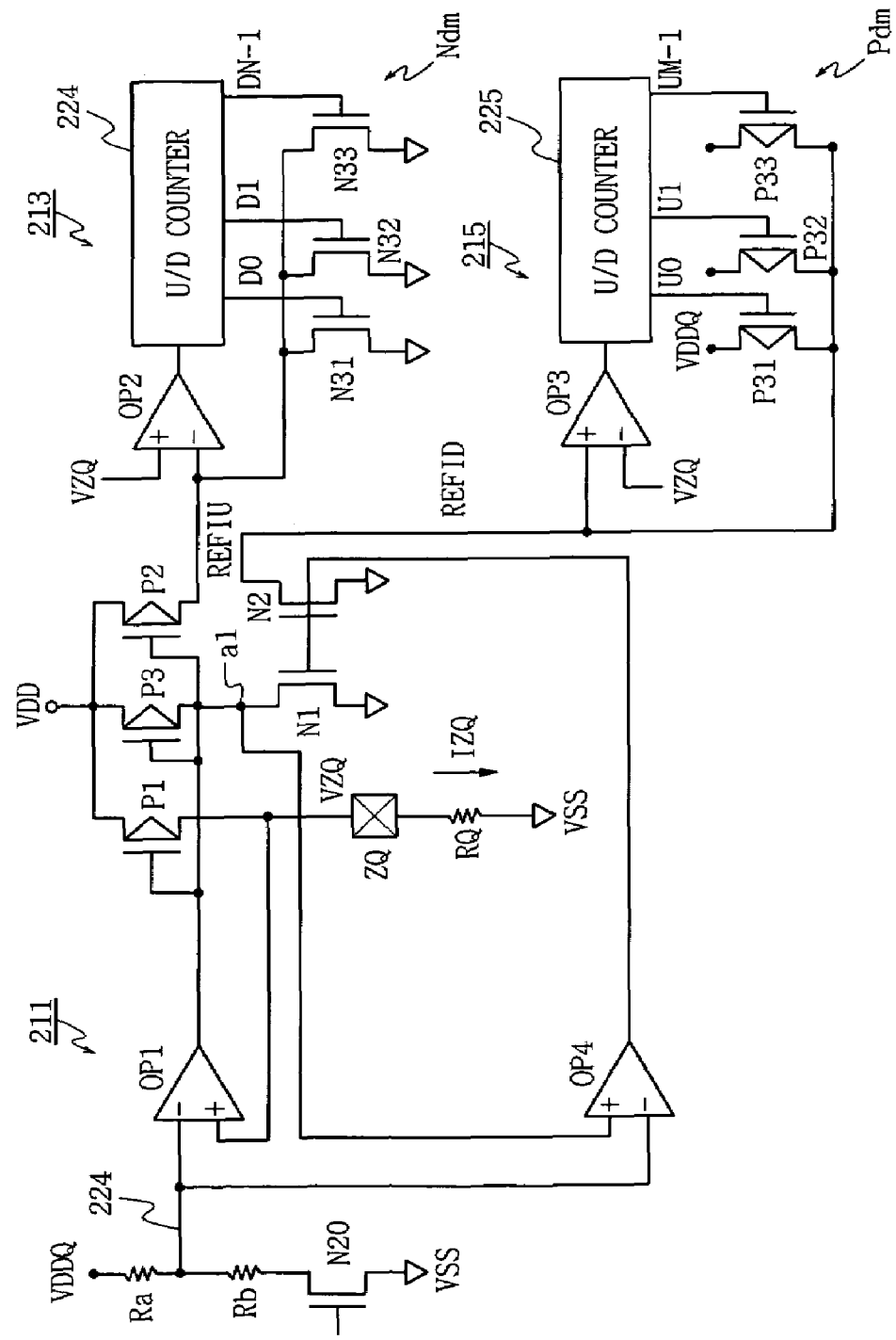
FIGS. 1a and 1b are a circuit diagram and a block diagram of a conventional programmable impedance control circuit.
Figure 1B:
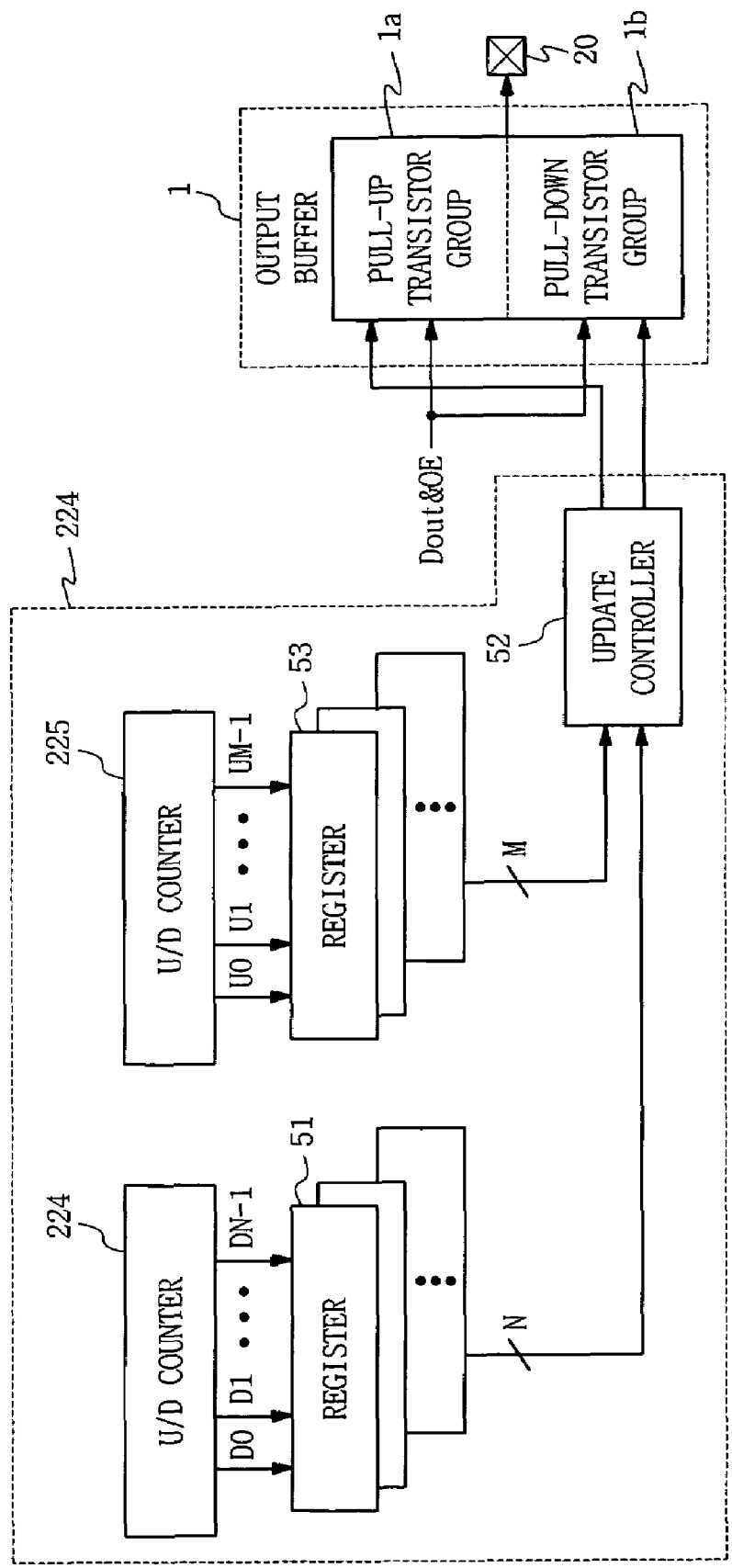

Hereinafter, exemplary embodiments of the present invention will be described in detail with reference to FIGS. 4 to 7 in which like reference characters refer to the same parts throughout the different views.

Figure 4:
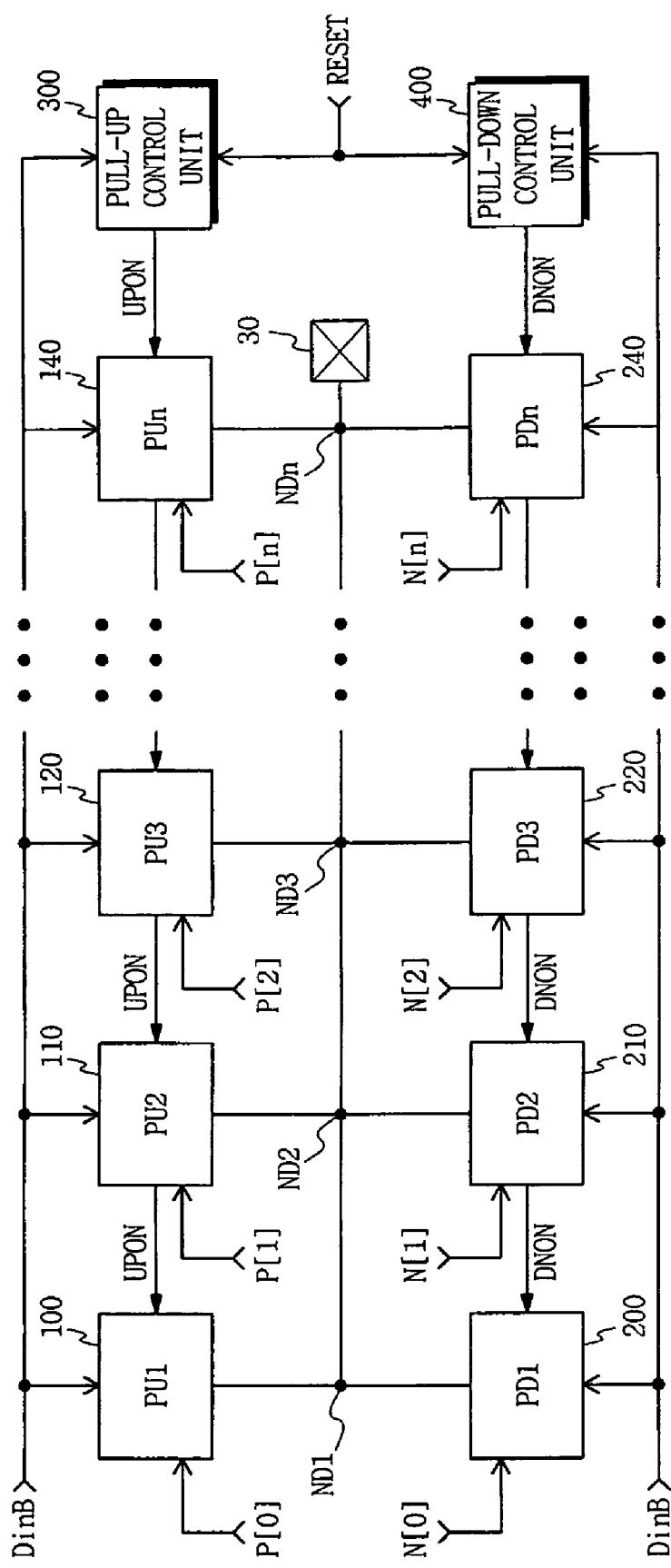
FIG. 4 is a block diagram illustrating a drive circuit having impedance control according to an exemplary embodiment of the invention.
Figure 5:
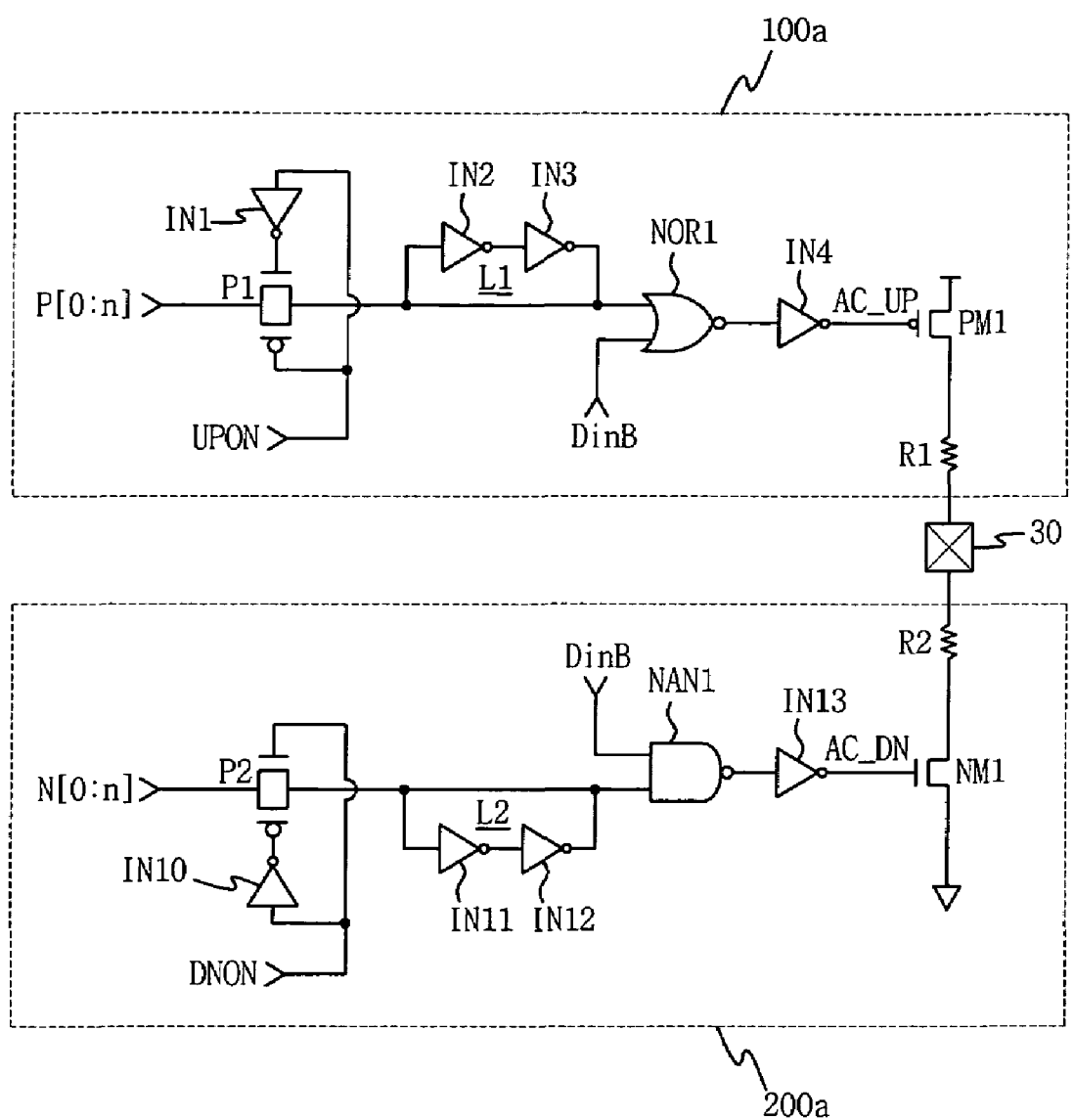
FIG. 5 is a circuit diagram illustrating a pull-up unit and a pull-down unit of FIG. 4.

FIG. 4 is a block diagram illustrating an impedance controllable output drive circuit in a semiconductor device according to an exemplary embodiment of the invention. FIG. 5 is a circuit diagram illustrating a pull-up unit and a pull-down unit of FIG. 4. Referring to FIG. 4, the impedance controllable output drive circuit includes pull-up units PU1-PUn, 100-140, pull-down units PD1-PDn, 200-240, a pull-up control unit 300 and a pull-down control unit 400. The pull-up units PU1-PUn 100-140 and the pull-down units PD1-PDn 200-240 correspond to an impedance matching array unit. Referring to FIG. 5, The pull-up units PU1-PUn 100-140 and the pull-down units PD1-PDn 200-240 of the impedance matching array unit include a plurality of transistors PM1-PMn and NM1-NMn, which are selectively driven by array drive control signals AC_UP, AC_DN generated by control code data P[0:n], N[0:n] so internal data DinB that has been impedance updated is output through an output pad 30. The pull-up control unit 300 and the pull-down control unit 400 correspond to the update prohibition control unit. The update prohibition control unit generates transfer control signals UPON, DNON to prohibit driving the plurality of transistors PM1-PMn and NM1-NMn during a time interval occurring when the internal data DinB transition, and the update prohibition control unit applies the transfer control signals UPON, DNON to the impedance matching array unit.

Figure 2:
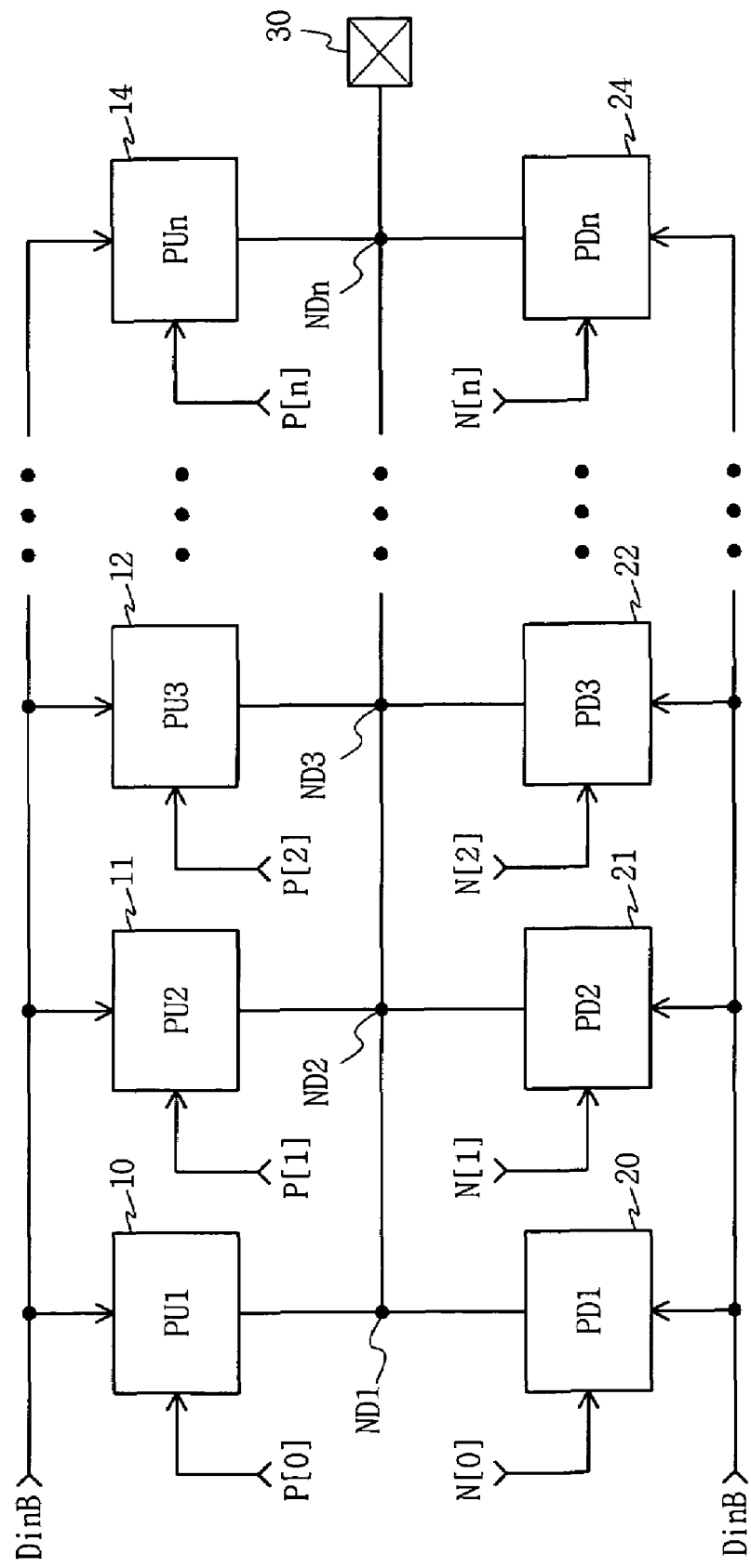
FIG. 2 is a block diagram of a conventional impedance controllable output drive circuit.

In FIG. 4, similar to the case illustrated in FIG. 2, the pull-up units PU1-PUn 100-140 and the pull-down units PD1-PDn 200-240 are connected commonly to the output pad 30. Control code data P[0:n] control an impedance of pull-up units PU1-PUn 100-140, and control code data N[0:n] control an impedance of pull-down units PD1-PDn 200-240. Control code data P[0:n] and N[0:n] are changed from a high logic level to a low logic level, or from a low logic level to a high logic level, by a PVT variation, and respective control code data P[0:n] and N[0:n] are allocated to the corresponding pull-up unit and pull-down unit, thus the number of active transistor arrays of the pull-up and pull-down units is adjusted.

When the internal data DinB output from an internal circuit of a semiconductor device is '1', data having a logic value of '0' is output through the output pad 30, thus control code data N[0:n] is not updated, but control code data P[0:n] is updated. On the contrary, when the internal data DinB is '0', data having a logic value of '1' is output, thus the pull-down control code N[0:n] is updated.

FIG. 5 is a circuit diagram illustrating an example of the pull-up and pull-down units shown in FIG. 4. With reference to FIG. 5, the configuration of one pull-up unit 100a and one pull-down unit 200a is illustrated.

Referring to FIG. 5, the pull-up unit 100a includes a pass transistor P1 for transmitting pull-up control code data P[0:n] in response to a pass transfer control signal UPON, a latch L1 that is constructed of two inverters IN2 and IN3 that latches the pull-up control code data P[0:n], a NOR gate NOR1 for receiving an output of the latch L1 and the internal data DinB, and generating a NOR response, an inverter IN4 for inverting an output of the NOR gate NOR1, a P-type MOS transistor PM1 driven in response to the array drive control signal AC_UP provided from an output of the inverter IN4, and a resistance R1 connected between the P-type MOS transistor PM1 and the output pad 30. The resistance R1 connected between the P-type MOS transistor PM1 and the output pad 30 belongs to an impedance matching transistor array, and the pass transistor P1, the latch L1, the NOR gate NOR1 and the inverter IN4 correspond to a drive control signal generating unit that generates the array drive control signal.

The pull-down unit 200a includes a pass transistor P2 for transmitting pull-down control code data N[0:n] in response to a pass transfer control signal DNON, a latch L2 that is constructed of two inverters IN11 and IN12 and that latches the pull-down control code data N[0:n], a NAND gate NAN1 for receiving an output of the latch L2 and the internal data DinB, and generating a NAND response, an inverter IN13 for inverting an output of the NAND gate NAN1, a N-type MOS transistor NM1 driven in response to the array drive control signal AC_DN provided from an output of the inverter IN13, and a resistance R2 connected between the N-type MOS transistor NM1 and the output pad 30.

Figure 3:
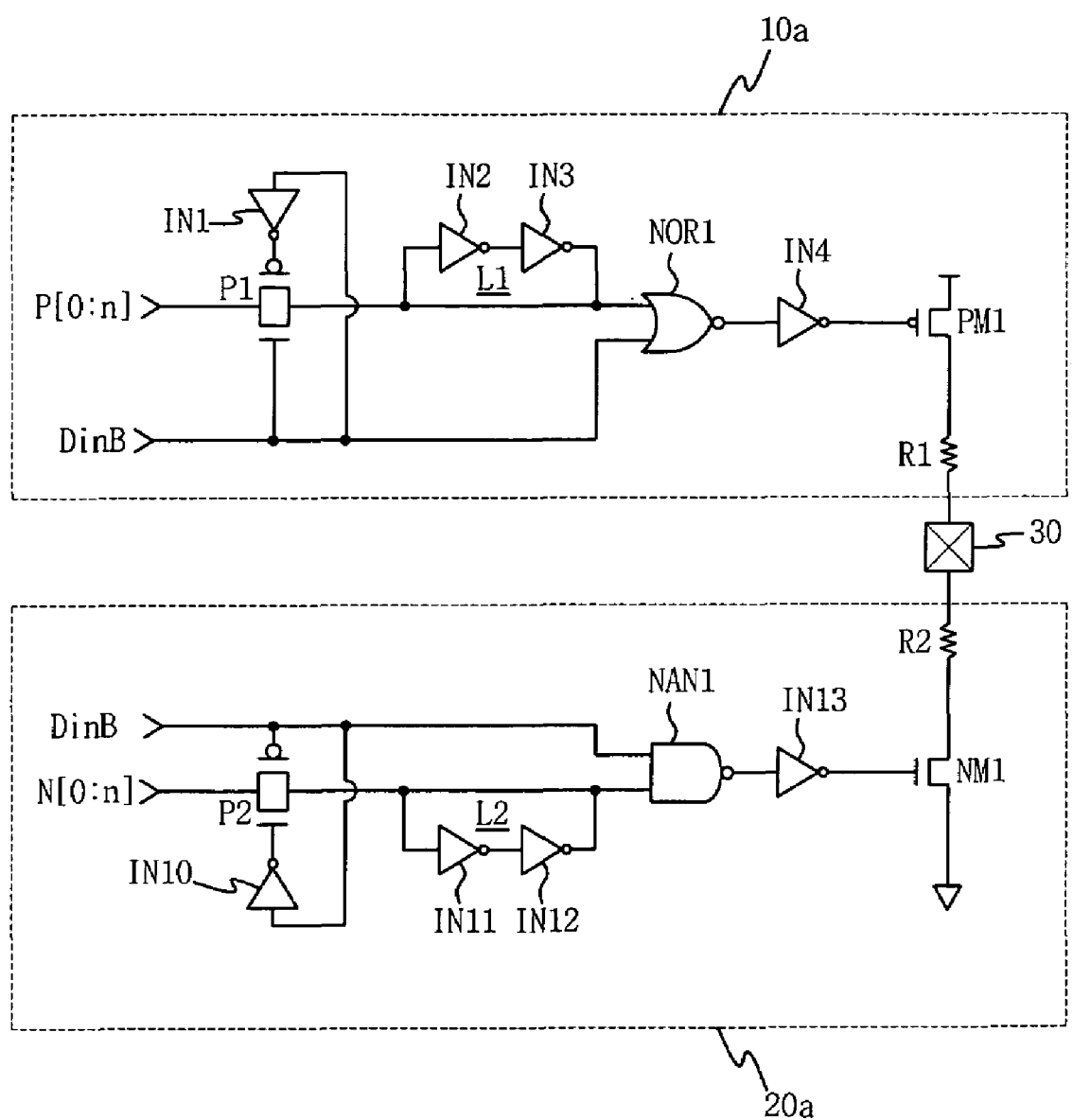
FIG. 3 is a circuit diagram illustrating an example of the configuration of pull-up and pull-down units shown in FIG. 2.

In FIG. 5, unlike in the circuit configuration of FIG. 3, the pass control signals of the pass gates P1 and P2 individually become transfer control signals UPON and DNON generated from the pull-up control unit 300 and the pull-down control unit 400. The pull-up unit 100a of FIG. 5 operates to drive an output data '1' when the internal data DinB is '0'. At this time, control code data P_CODE is passed through the pass transistor P1 by the transfer control signal UPON as a sampling clock, and becomes a control code data stored at the latch L1. The transfer control signal UPON is generated as a low logic level while the pull-down unit 200a is enabled.

The pull-down unit 200a operates to drive an output data '0' when the internal data DinB is '1'. An impedance control code data N_CODE is passed through the pass transistor P2 and is stored at the latch L2, by a transfer control signal DNON generated as a high logic level while the pull-up unit 100a is enabled, and is used to drive an output data '0' when the internal data DinB is '1'.

Figure 6:
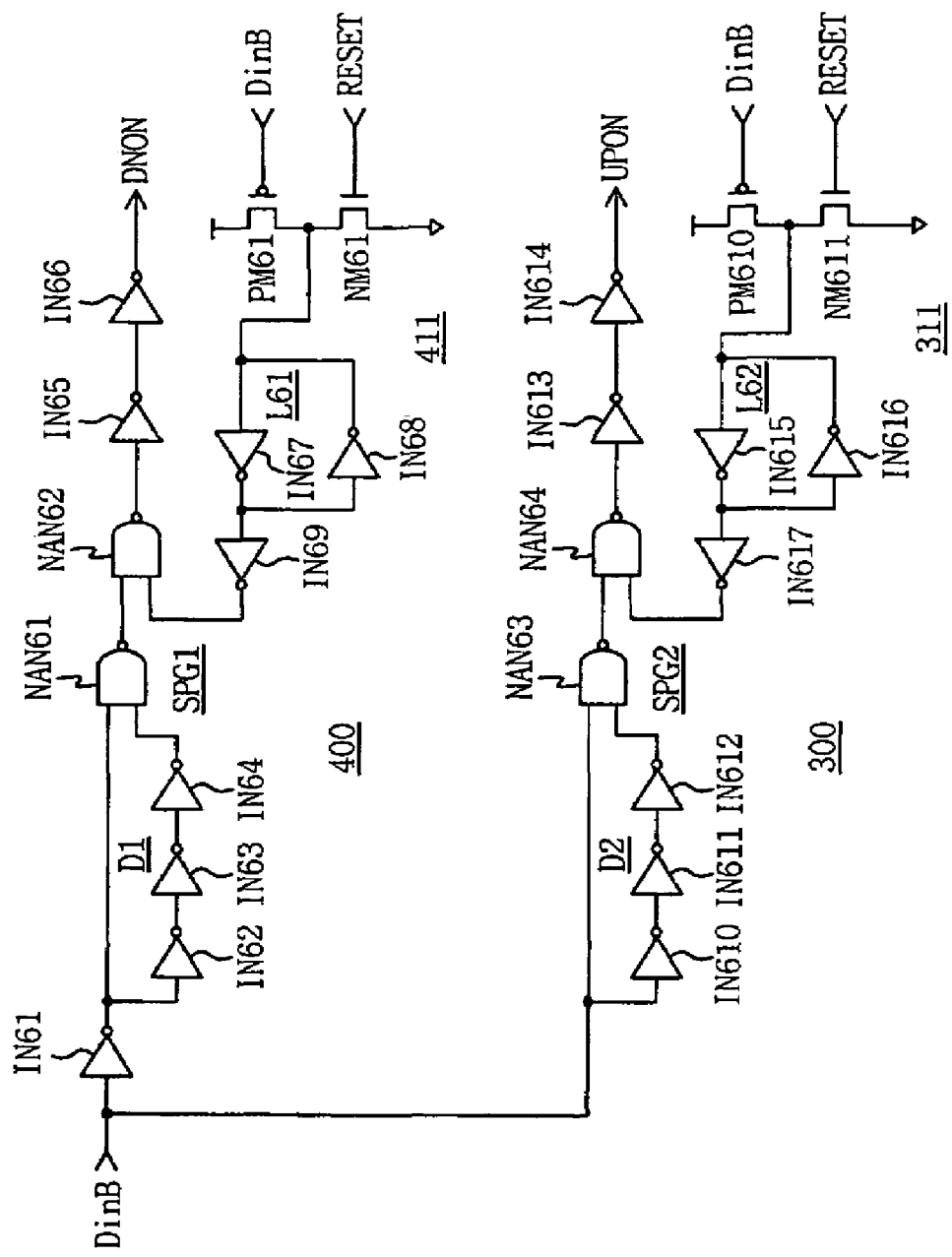
FIG. 6 is a circuit diagram illustrating a pull-up control unit and a pull-down control unit of FIG. 4.

FIG. 6 is a circuit diagram illustrating a pull-up control unit and a pull-down control unit as shown in FIG. 4. FIG. 6 includes a pull-up control unit 300 and a pull-down control unit 400 as the update prohibition control unit, which generate the transfer control signals UPON, DNON. Referring to FIG. 6, the pull-up control unit 300 includes a short pulse generator SPG2 constructed of three inverters IN610-1N612 and a NAND gate NAN63, a NAND gate NAN64, output inverters IN613 and IN614, inverters IN615-IN617 constituting a pull-up initial update part 311, and MOS transistors PM610 and NM611. The pull-down control unit 400 includes a short pulse generator SPG1 constructed of four inverters IN61-IN64 and a NAND gate NAN61, a NAND gate NAN62, output inverters IN65 and IN66, inverters IN67-1N69 constituting a pull-down initial update part 411, and MOS transistors PM61 and NM61.

A short pulse generating unit constructed of the short pulse generators SPG1 and SPG2 generates the transfer control signals DNON, UPON in response to the internal data DinB. The initial update parts 311 and 411 are connected to corresponding short pulse generators, and operate so an impedance update of the impedance matching array unit is performed during a time interval occurring from after a power reset to before the internal data initially transition, thereby an impedance matching is initially and promptly attained without a data training sequence.

Figure 7:
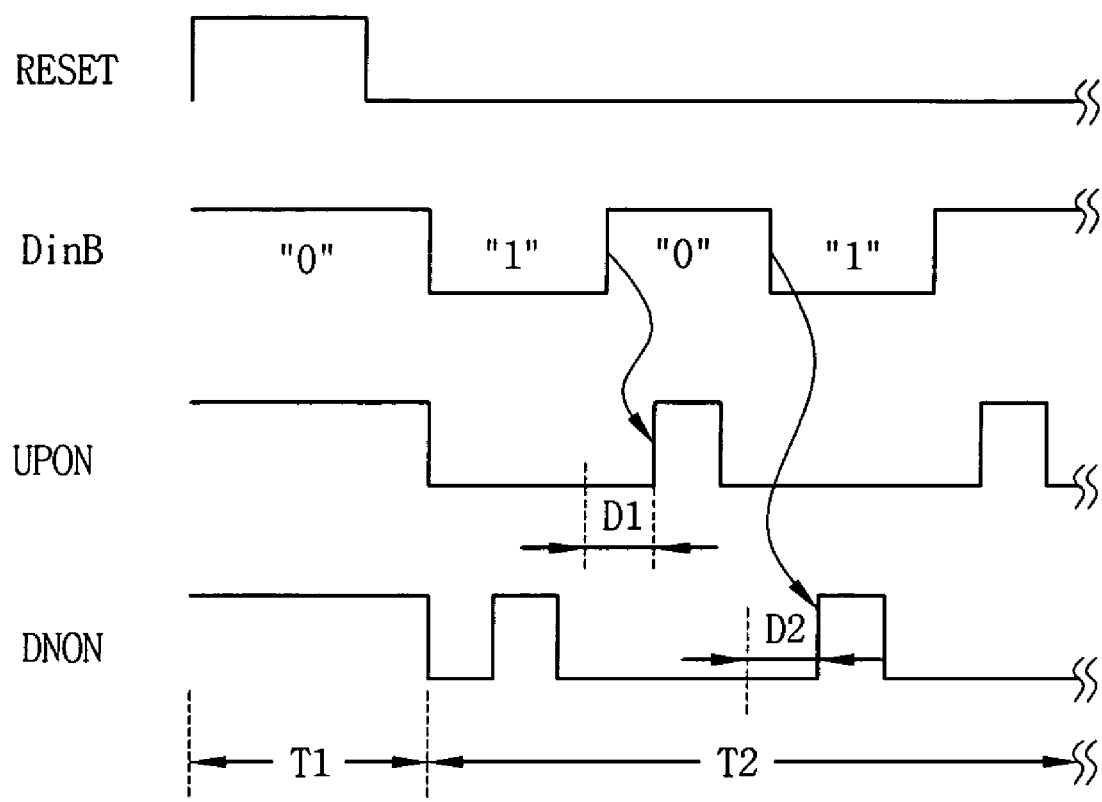
FIG. 7 is a timing diagram illustrating an operation of the pull-up control unit and the pull-down control unit of FIG. 6.

FIG. 7 is a timing diagram for the operation of the circuit of FIG. 6. Waveform signals of FIG. 7 correspond to signals of the circuit of FIG. 6.

In FIG. 6, the pull-down control unit 400 generates a transfer control signal DNON for sampling a pull-down impedance control code data N[0:n], that is, a transmission selection signal applied to a pass transistor P2 of FIG. 5. The transfer control signal DNON is generated as a pulse type signal having a delay D2 when the internal data DinB is transitioned from '1' to '0' as shown in the timing drawing of FIG. 7. The data '0' or '1' represented in the data input waveform indicates a non-inverted data Din, thus is provided unlike a logic level of the internal data DinB. An impedance matching error caused during a data transition is prevented by the delay D2 realized by the short pulse generator SPG1 of FIG. 6. In other words, the pass transistor P2 of FIG. 5 cannot transmit the control code during the delay interval D2, thus an impedance update operation does not occur. After the delay D2, the transfer control signal DNON becomes a high logic level, thus pull-down control code data N[0:n] is latched to the latch L2 of FIG. 5, and an update of the impedance code data is performed deviating from the data transition time interval. Consequently, the pull-down control unit 400 functioning as one of the update prohibition control units generates the transfer control signal DNON to prohibit driving the transistors within the pull-down units of FIG. 4 during a time interval when internal data transition.

Similarly, the pull-up control unit 300 of FIG. 6 generates a transfer control signal UPON for sampling a pull-up impedance control code data P[0:n], that is, a transmission selection signal applied to a pass transistor P1 of FIG. 5. The transfer control signal UPON is generated as a pulse type signal having a delay D1 when the internal data DinB is transitioned from '0' to '1' as shown in the timing drawing of FIG. 7. An impedance matching error caused during a data transition is avoided by the delay D1 realized by the short pulse generator SPG2 of FIG. 6. In other words, the pass transistor P1 of FIG. 5 cannot transmit a control code during the delay interval D1, thus an impedance update operation does not occur. After the delay D1, the transfer control signal UPON becomes a high logic level, thus pull-up control code data P[0:n] is latched to the latch L1 of FIG. 5, and an update of the impedance code data is performed deviating from the data transition time interval. Consequently, the pull-up control unit 300 functioning as another update prohibition control unit generates the transfer control signal UPON to prohibit driving the transistors within the pull-up units of FIG. 4 during a time interval when internal data transition.

Next, an impedance update promptly performed without a training sequence in reset operation will be described as follows. In case the initial update part 311, 411 is not adapted in FIG. 6, and when a data transition does not occur, a sampling clock for sampling a control code data does not occur and so an impedance code update does not occur. When a data transition is generated initially after a power reset, data having an undesirable impedance value is output and thus distortion or reflection may occur in the output signal. To address such data transitions, a start-up part for determining the impedance of data where the transition will occur is the initial update part 311, 411.

When a reset signal RESET is applied to an N-type MOS transistor NM611, NM61 of the initial update part 311, 411, the internal data DinB becomes '1' and an initial value of the transfer control signals UPON, DNON become '1' even though the internal data DinB is not transitioned. At this time, an output data becomes '0' by the internal data DinB, thus there is no difficulty even if the pull-up impedance control code is updated. In the case of the pull-down, data is not changed during a reset time interval, thus there is no difficulty in signal transmission even though the impedance is changed in the middle of the operation.

When the internal data DinB transition from '1' to '0' initially after the end of a reset, a pull-down code is updated and an output of the reset path formed along the latch L62 becomes '1'. Then, the transfer control signal UPON is generated by the short pulse generator SPG2. As described above, an impedance update is performed by the power reset. Thus, an update difficulty occurring where the first transition of data is generated can be avoided. Consequently, the initial update part controls generation of the sampling clock for an impedance update during a time interval that is from power-up until immediately before a data transition.

Accordingly, a training sequence for an impedance update is not employed. Thus a cycle is eliminated, an impedance value of the first data has a normal value, and consistency of initial data is enhanced.

As described above, according to exemplary embodiments of the invention, an impedance matching error caused during a data transition is avoided, and an impedance update can be performed promptly without a training sequence during a reset operation, thus reliability is provided from a transmission of the first data.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A drive circuit having impedance control, comprising:
   an impedance matching array unit having a plurality of transistors, the plurality of transistors selectively driven in accordance with array drive control signals generated by control code data; and
   an update prohibition control unit for generating transfer control signals to prohibit driving the transistors during first and second time intervals occurring when there are internal data transitions, and applying the transfer control signals to control the impedance matching array unit.

2. The circuit of claim 1, wherein the update prohibition control unit comprises:
   short pulse generating parts for generating the transfer control signals in response to the internal data; and
   initial update parts, which are connected to the short pulse generating part and by which an impedance update of the impedance matching array unit is performed during a third time interval occurring from after a power reset to before an initial internal data transition.

3. The circuit of claim 1, wherein the impedance matching array unit comprises:
   pull-up and pull-down drive control signal generating parts for latching the control code data received in response to the transfer control signal from the update prohibition control unit, gating the control code data with the internal data, and generating the array drive control signal,
   wherein the plurality of transistors is connected commonly.

4. The circuit of claim 1, further comprising:
   a drive control signal generating unit for receiving the control code data for impedance matching, the transfer control signals, and internal data output from an internal circuit of the semiconductor device, and generating the array drive control signals.

5. A semiconductor device having an internal circuit and an impedance controllable output drive circuit that drives data from the internal circuit and transfers the driven data to an output terminal, the impedance controllable output drive circuit comprising:
   a first transistor array unit connected to the output terminal that responds to control code data for an impedance update operation when the data from the internal circuit is applied in a first logic state;
   a second transistor array unit connected to the output terminal that responds to the control code data for the impedance update operation when the data from the internal circuit is applied in a second logic state; and
   an update prohibition control unit to prohibit the impedance update operation of the first and second transistor array units during a first time interval, occurring while the data from the internal circuit transition, and to perform the impedance update operation after a lapse of the first time interval.

6. The device of claim 5, further comprising a start-up determining part, which is connected to the update prohibition control unit and performs the impedance update operation of the first and second transistor array units during a second time interval, occurring from after a power reset to before the data from the internal circuit transition.

7. An impedance controllable output drive circuit for use in a semiconductor device, the circuit comprising:
   a pull-up array unit having a plurality of P-type metal oxide semiconductor (MOS) transistors selectively driven by a pull-up array drive control signal generated by pull-up control code data so first internal data that has been impedance updated is output through an output pad;
   a pull-down array unit having a plurality of N-type MOS transistors selectively driven by a pull-down array drive control signal generated by pull-down control code data so second internal data that has been impedance updated is output through the output pad; and
   an update prohibition control unit for generating a transfer control signal to prohibit driving the P-type and N-type MOS transistors during a first time interval occurring while the first or second internal data transition, and applying the transfer control signal to the pull-up and pull-down array units.

8. The circuit of claim 7, wherein an element of the pull-up array unit comprises a first pass transistor for transmitting the pull-up control code data in response to the transfer control signal, a first latch connected to an output of the first pass transistor to latch the pull-up control code data, a NOR gate for receiving an output of the first latch and the first internal data, a first inverter for inverting an output of the NOR gate, a P-type MOS transistor driven in response to the pull-up array drive control signal provided from an output of the first inverter, and a first resistance connected between the P-type MOS transistor and the output pad.

9. The circuit of claim 8, wherein an element of the pull-down array unit comprises a second pass transistor for transmitting the pull-down control code data in response to the transfer control signal, a second latch connected to an output of the second pass transistor to latch the pull-down control code data, a NAND gate for receiving an output of the second latch and the second internal data, a second inverter for inverting an output of the NAND gate, an N-type MOS transistor driven in response to the pull-down array drive control signal provided from an output of the second inverter, and a second resistance connected between the N-type MOS transistor and the output pad.

10. The circuit of claim 9, wherein the update prohibition control unit comprises:
a short pulse generating part for generating the transfer control signal in response to the first or second internal data; and
an initial update part, which is connected to the short pulse generating part and by which an impedance update of the pull-up and pull-down array units is performed during a second time interval, occurring from after a power reset to before the first or second internal data initially transition.

11. An impedance control method in a semiconductor device, the method comprising:
preparing an impedance matching array unit having a plurality of transistors by which internal data that has been impedance updated is output through an output pad;
applying a sampling clock to latch control code data to the impedance matching array unit to perform an impedance update of the impedance matching array unit during a time interval occurring from a power reset to before the internal data initially transition; and
applying the sampling clock to latch the control code data to the impedance matching array unit to perform an impedance update of the impedance matching array unit after the internal data transition plus a time delay.

12. The method of claim 11, wherein performing the impedance update is obtained through an initial update part for generating the sampling clock in response to a power-up reset signal.

* * * * *